(12) United States Patent
Dong

(10) Patent No.: US 7,932,159 B2
(45) Date of Patent: Apr. 26, 2011

(54) FLASH MEMORY DEVICE AND METHOD OF FABRICATING THE SAME

(75) Inventor: Cha Deok Dong, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/943,578

(22) Filed: Nov. 10, 2010

(65) Prior Publication Data

US 2011/0059594 A1    Mar. 10, 2011

(30) Foreign Application Priority Data

Feb. 22, 2008   (KR) ........................ 10-2008-0016126

(51) Int. Cl.
*H01L 21/76*   (2006.01)
(52) U.S. Cl. ........ 438/424; 438/692; 438/700; 438/426; 438/427; 257/E21.332; 257/E21.209; 257/E21.422
(58) Field of Classification Search .................. 438/424, 438/692, 700, 426, 427; 257/E21.332, E21.209, 257/E21.422
See application file for complete search history.

(56) References Cited

U.S. PATENT DOCUMENTS

| 7,179,717 | B2 | 2/2007 | Sandhu et al. | |
| 7,402,886 | B2 * | 7/2008 | Yuan | 257/510 |
| 7,855,409 | B2 | 8/2009 | Dong | |
| 2003/0001204 | A1 | 1/2003 | Kobayashi | |
| 2006/0270181 | A1 | 11/2006 | Sandhu et al. | |
| 2008/0268608 | A1 * | 10/2008 | Kim et al. | 438/424 |

FOREIGN PATENT DOCUMENTS

| CN | 1591837 A | 3/2005 |
| KR | 10-2000-0045372 | 7/2000 |
| KR | 10-2006-0005062 | 1/2006 |
| KR | 10-2007-0055716 | 5/2007 |
| KR | 10-2007-0064835 | 6/2007 |

OTHER PUBLICATIONS

Translation of the First Office Action for corresponding Chinese Patent Application No. 200810132034.0, dated Jan. 22, 2010.

* cited by examiner

*Primary Examiner* — Matthew S Smith
*Assistant Examiner* — Wilner Jean Baptiste
(74) *Attorney, Agent, or Firm* — Marshall, Gerstein & Borun LLP

(57) ABSTRACT

The present invention relates to flash memory devices and a method of fabricating the same. In an aspect of the present invention, the flash memory device includes trenches formed in a semiconductor substrate and having a step at their lower portion, a tunnel insulating layer formed in an active region of the semiconductor substrate, first conductive layers formed on the tunnel insulating layer, an isolation layer gap-filling between the trenches and the first conductive layers, and a second conductive layer formed on the first conductive layer and having one side partially overlapping with the isolation layers.

12 Claims, 4 Drawing Sheets

FLASH MEMORY DEVICE AND METHOD OF FABRICATING THE SAME

CROSS-REFERENCES TO RELATED APPLICATIONS

This is a division of U.S. application Ser. No. 12/147,194 filed Jun. 26, 2008, which claims priority to Korean patent application number 10-2008-0016126, filed on Feb. 22, 2008, which is incorporated by reference in its entirety.

BACKGROUND OF THE INVENTION

The present invention relates to flash memory devices and a method of fabricating the same and, more particularly, to flash memory devices and a method of fabricating the same, which can improve the coupling ratio of a cell.

With the high integration of semiconductor substrates, the process of forming isolation layers becomes more complicated. For this reason the isolation layers are formed using a shallow trench isolation (STI) method of forming trenches in a semiconductor substrate and gap-filling the trenches. Meanwhile, there are several methods other than the STI method. The methods can include self-aligned (SA)-STI and self-aligned floating gate (SA-FG) formation methods in which trenches are formed at the same time by etching an exposed semiconductor substrate at a specific depth, while patterning a tunnel insulating layer, a polysilicon layer and a hard mask layer stacked over the semiconductor substrate, and an oxide layer is formed on the entire surface so that the trenches are gap-filled.

In the prior art, the same critical dimension (CD) is applied to the active region and the floating gate, while using the SA-FG formation method. Accordingly, the semiconductor substrate is divided into an active region and a field area, each of which are about half a pattern pitch. In high-integrated devices, it is difficult to gap-fill an excessively small trench area potentially requiring 7 to 8 complicated steps to form the isolation layers.

As the CD of the active region becomes small, there is no method of increasing the size of the floating gate. This poses a significant problem in ensuring the coupling ratio of a cell. However, currently, the thickness level of a dielectric layer having an ONO stacked structure of an oxide layer, a nitride layer and an oxide layer has reached its limit. Accordingly, there is a need for a new method for ensuring the coupling ratio of a cell.

BRIEF SUMMARY OF THE INVENTION

The present invention is directed towards a flash memory device and a method of fabricating the same, which can improve the coupling ratio of a cell, in such a way as to increase the area of a floating gate relative to the area of a tunnel insulating layer by reducing the area of an active region in which the tunnel insulating layer is formed using an etch process employing a shift mask.

A flash memory device according to an aspect of the present invention may include trenches formed in a semiconductor substrate having a step at their lower portion, a tunnel insulating layer formed in an active region of the semiconductor substrate, first conductive layers formed on the tunnel insulating layer, an isolation layer gap-filling between the trenches and the first conductive layers, and a second conductive layer formed on the first conductive layer and having one side partially overlapping with the isolation layers.

An area in which a trench is formed can have a width wider than that of the active region in which the tunnel insulating layer is formed. The second conductive layer can be overlapped with a side of the trench, having a low step. A width of the second conductive layer, which corresponds to $\frac{1}{10}$ to $\frac{9}{10}$, can be overlapped with the isolation layer.

The first and second conductive layers can form a ⊓-shaped floating gate. The first and second conductive layers may be formed from polysilicon. The isolation layer can be formed of a high-density plasma (HDP) oxide layer.

The flash memory device may further include a dielectric layer formed on the isolation layers and the second conductive layer, and a third conductive layer formed on the dielectric layer.

A method of fabricating a flash memory device according to another aspect of the present invention may include providing a semiconductor substrate in which first trenches are formed in an isolation region and a stacked layer of a tunnel insulating layer and a first conductive layer is formed in an active region, etching the first conductive layer and the tunnel insulating layer by employing etch masks through which a part of the first conductive layer and a part of the first trenches are exposed on boundaries of the isolation region and the active region, thus reducing a width of the active region, and etching the semiconductor substrate including the first trenches to thereby form second trenches deeper than the first trenches, forming isolation layers to gap-fill between the first and second trenches and the first conductive layers, and forming a second conductive layer on the first conductive layer so that one side of second conductive layer is partially overlapped with the isolation layers.

The etch masks can be shifted 10 to 90% toward the isolation region. An area in which the first and second trenches can be formed may have a width increased as much as the reduced width of the active region.

The first trench can have a width smaller than that of a target trench. The first trench can be shallower than a target depth.

One side of an area in which the first and second trenches are formed can have a stair-shaped step. The second conductive layer can be overlapped on a lower step side within an area in which the first and second trenches are formed. A width of the second conductive layer, which corresponds to $\frac{1}{10}$ to $\frac{9}{10}$, can be overlapped with the isolation layer.

The first and second conductive layers can constitute a ⊓-shaped floating gate. The first and second conductive layer can be formed from polysilicon. The isolation layer can be formed of a HDP oxide layer.

The method can further include forming a dielectric layer on the isolation layers and the second conductive layer, and forming a third conductive layer on the dielectric layer.

DESCRIPTION OF SPECIFIC EMBODIMENT

Now, the present invention will be described in terms of specific embodiments and with reference to the accompanying drawings. However, the present invention is not limited to the disclosed embodiments, but may be implemented in various ways. The embodiments are provided to complete the disclosure of the present invention and to allow those having ordinary skill in the art to understand the scope of the present invention. The present invention is defined by the category of the claims.

FIGS. 1A to 1H are sectional views illustrating a method of fabricating a flash memory device in accordance with an embodiment of the present invention.

Figure 1A:
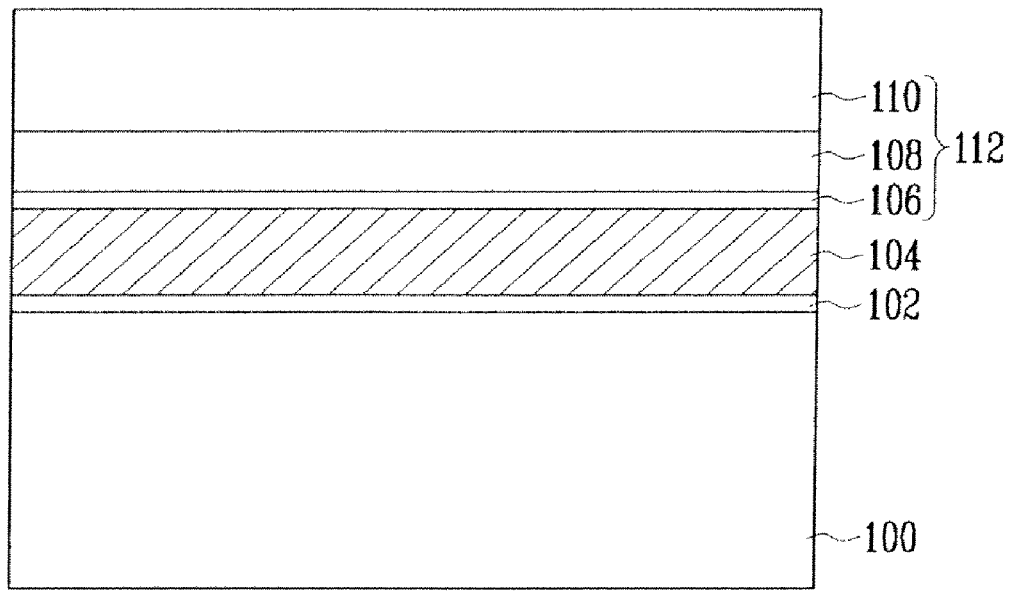
FIGS. 1A to 1H are sectional views illustrating a method of fabricating a flash memory device in accordance with an embodiment of the present invention.

Referring to FIG. 1A, a tunnel insulating layer 102, a first conductive layer 104 and an isolation mask 112 are sequentially formed over a semiconductor substrate 100. The isolation mask 112 can have a stacked structure of a buffer oxide layer 106, an etch-stop layer 108 and a hard mask layer 110. Here, the hard mask layer 110 can be formed of a single layer, such as nitride, oxide or amorphous carbon, or a stacked layer of nitride, oxide or amorphous carbon. The etch-stop layer 108 can be formed from nitride-based material such as silicon nitride (Si3N4) or silicon oxynitride (SiON). The hard mask layer 110 and the etch-stop layer 108 are deposited to a thickness sufficient enough to protect the first conductive layer 104 in an etch process for forming subsequent first and second trenches (not shown).

The first conductive layer 104 is used to form a floating gate of the flash memory device and can be formed of a polysilicon layer, a metal layer, or a stacked layer of the polysilicon layer and the metal layer. In the case in which the polysilicon layer is used, the first conductive layer 104 is formed of an undoped polysilicon layer. The tunnel insulating layer 102 can be formed from silicon oxide (SiO2). In this case, an oxidation process can be used.

Figure 1B:
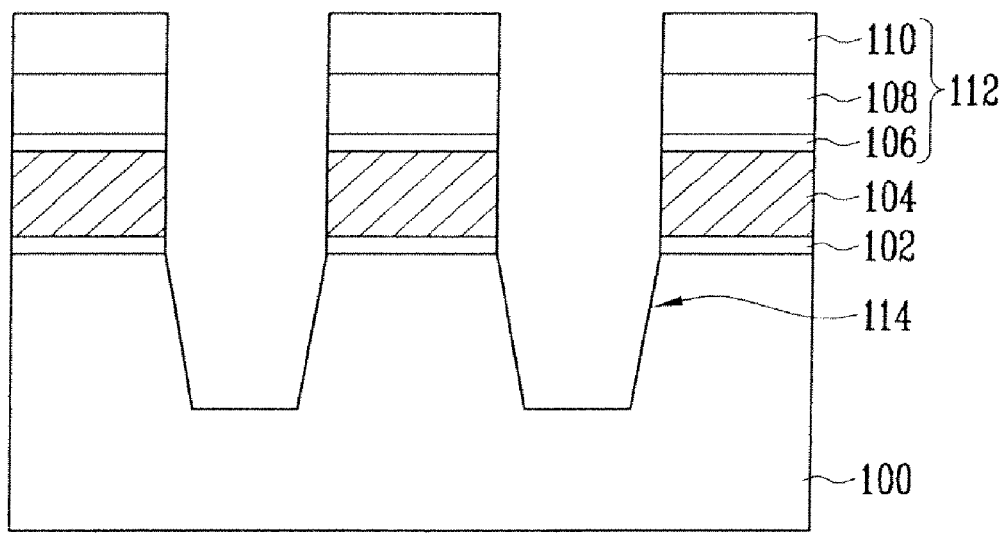

Referring to FIG. 1B, an isolation region of the semiconductor substrate 100 is exposed by sequentially etching the isolation mask 112, the first conductive layer 104 and the tunnel insulating layer 102 of the isolation region by using an etch process employing a mask (not shown). More specifically, photoresist is coated on the isolation mask 112 to thereby form a photoresist layer (not shown). Photoresist patterns (not shown) through which the isolation mask 112 of the isolation region is exposed are formed by performing exposure and development processes. The isolation region of the isolation mask 112 is etched using an etch process employing the photoresist patterns. The photoresist patterns are then removed. The first conductive layer 104 and the tunnel insulating layer 102 are etched using an etch process employing the patterned isolation mask 112. Consequently, the semiconductor substrate 100 of the isolation region is exposed.

Next, the semiconductor substrate 100 of the exposed isolation region is etched to thereby form first trenches 114. At this time, each of the first trenches 114 has a width smaller than that of a target trench, which will be formed finally, and a depth shallower than a target depth, from a surface of the semiconductor substrate 100. The first trenches 114 can be formed using a SA-STI method. Meanwhile, in the etch process for forming the first trenches 114, a part of the hard mask layer pattern 110 may be etched.

Figure 1C:
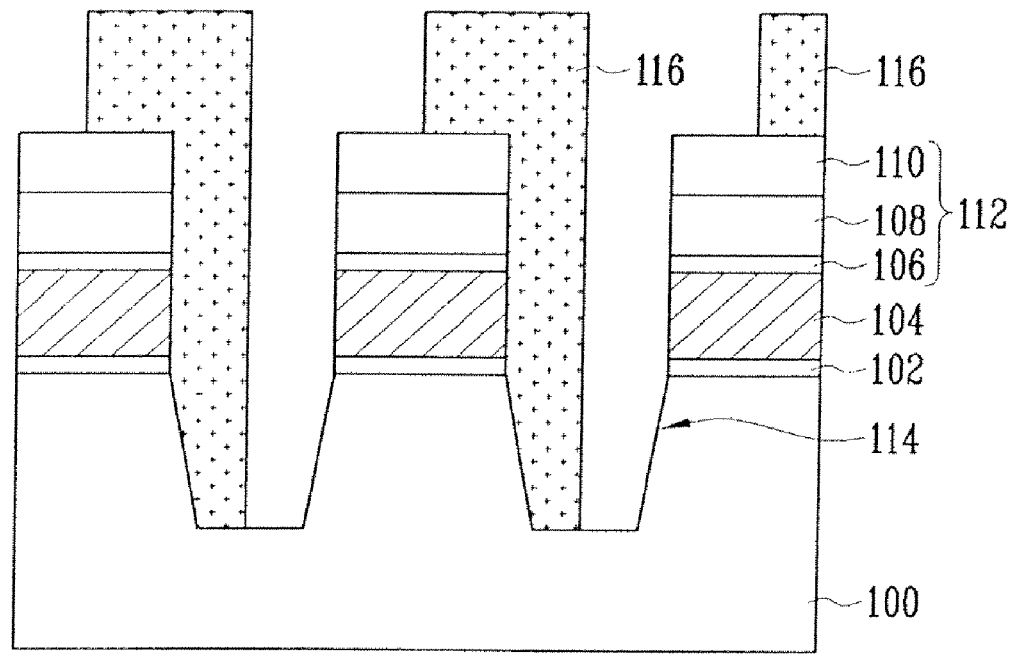

Referring to FIG. 1C, etch masks 116 through which a part of the first trenches 114 and a part of the surface of the isolation mask pattern 112 are exposed are formed at the boundary of the active region and the isolation region. Hereinafter, the etch masks 116 is called a shift mask.

The shift masks 116 are used to form subsequent second trenches. The shift masks 116 are shifted toward the isolation region in the range of 10 to 90%. More specifically, the shift masks 116 are shifted toward the isolation region in the range of 50% to 90%.

At this time, if the shift masks 116 are shifted within 50%, a width of a subsequent target trench (not shown) is wide, whereas the first conductive layer patterns 104 and the tunnel insulating layer 102 are less reduced. Thus, the coupling ratio of a cell is relatively insufficient. If the shift masks 116 are shifted within a range of 50% to 90%, it is advantageous in terms of the coupling ratio of a cell since the area of the active region is correspondingly reduced. Accordingly, it is preferred that the shift masks 116 be formed to the extent that a desired coupling ratio of a cell can be ensured. In the drawings, it is illustrated that the shift masks 116 are shifted 50% toward the isolation region for convenience of description.

Meanwhile, the shift masks 116 can be formed using photoresist patterns. In this case, the photoresist patterns can be formed by coating photoresist on the isolation mask pattern 112, including the first trenches 114, in order to form a photoresist layer (not shown) and then patterning the photoresist layer (not shown) using exposure and development processes.

Figure 1D:
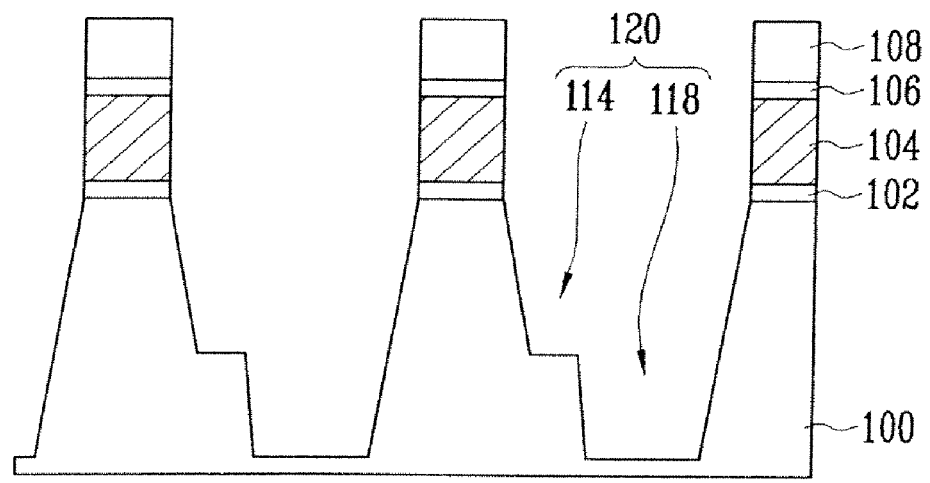

Referring to FIG. 1D, the isolation mask patterns 112, the first conductive layer patterns 104, the tunnel insulating layer 102, and the semiconductor substrate 100 including the first trenches 114 are etched using an etch process employing the shift masks (refer to 116 of FIG. 1C). Consequently, the exposed isolation mask patterns 112, the exposed first conductive layer patterns 104 and the exposed tunnel insulating layer 102 of the area in which the shift masks (refer to 116 of FIG. 1C) are not formed are etched, so that the width of the active region is decreased.

In general, the coupling ratio of a cell is expressed by the capacitance of a gate pre-metal dielectric layer to the sum of capacitance of the tunnel insulating layer and the gate pre-metal dielectric layer. Thus, when the width of the active region decreases, the area of the tunnel insulating layer 102 decreases, resulting in reduced capacitance of the tunnel insulating layer 102. Accordingly, the coupling ratio of a cell is increased entirely.

The semiconductor substrate 100 exposed below the tunnel insulating layer 102 and the semiconductor substrate 100 exposed at the bottoms of the first trenches 114 are etched, forming second trenches 118 on one side of each of the first trenches 114. The second trench 118 has a depth deeper than that of the first trench 114. At this time, the second trench 118 can be formed by performing etching up to a depth of a target trench to be formed. To this end, as described above, it is necessary to form an etch-stop layer, which can sufficiently ensure the depth of the second trench 118, by using the hard mask layer 110 and the etch-stop layer 108 having a sufficient thickness. The second trench 118 formed as described above can have a width smaller or larger than that of the first trench 114 depending on a degree that the shift masks (refer to 116 of FIG. 1C) are shifted.

Thus, a target trench 120 comprised of the first trench 114 and the second trench 118 is formed. The target trench 120 has one side having a stair-shaped step, thus having a width expanded as much as the width of the reduced active region due to the left and right asymmetrical shape. Accordingly, the aspect ratio of the target trench 120 can be increased and, when forming isolation layers in a subsequent process, a gap-fill characteristic of the target trench 120 can be improved.

As described above, the method of reducing the width of the active region and increasing the width of the isolation region using the shift masks (refer to 116 of FIG. 1C) does not require fabrication of additional and complicated masks. Accordingly, this method is advantageous in that it can define a desired pattern stably.

Meanwhile, the shift masks (refer to 116 of FIG. 1C) and the hard mask layer patterns (refer to 110 of FIG. 1C) may be partially etched and removed in the etch process of the exposed isolation mask patterns 112, the exposed first conductive layer patterns 104, the exposed tunnel insulating layer 102 of the area in which the shift masks (refer to 116 of FIG. 1C) are not formed, and the etch process for forming the second trenches 118. The remaining shift masks (refer to 116 of FIG. 1C) can be removed using an etch process.

Figure 1E:
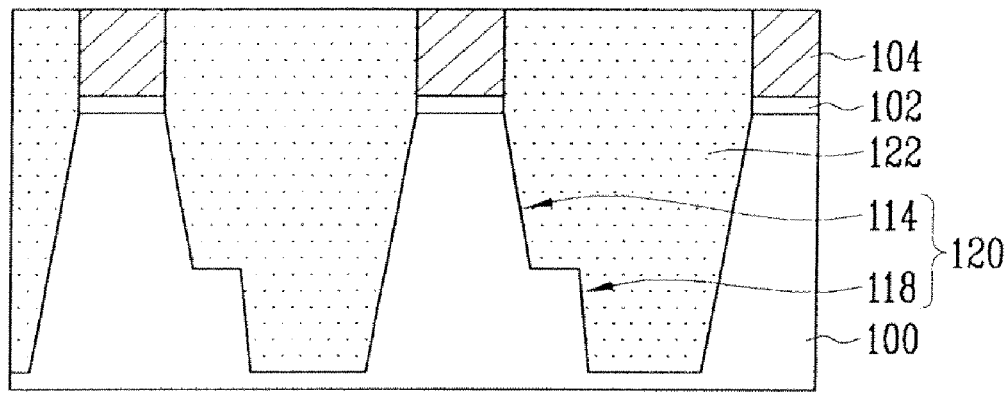

Referring to FIG. 1E, an insulating layer (not shown) is deposited on the entire surface, including the target trenches 120, so that the target trenches 120 are gap-filled. An etch process is performed on the insulating layer until the etch-stop layer 108 is exposed.

Here, the insulating layer can be formed of a high-density plasma (HDP) oxide layer using a HDP type chemical vapor deposition (CVD) method. In this case, since the target trenches 120 having an increased aspect ratio are gap-filled as in FIG. 1D, the target trenches 120 can be gap-filled easily without void although an existing trench gap-fill method such as HDP-CVD is employed. Accordingly, since an existing trench gap-fill technology can be applied to fabrication of high-integrated devices without change, the process can be simplified significantly and the prime cost can be saved.

Further, the etch process on the insulating layer can be performed using a polishing etch process. The polishing etch process can be performed using a chemical mechanical polishing (CMP) process. Thus, the insulating layer remains only within the target trenches 120 of the isolation region, thus forming isolation layers 122.

Next, the etch-stop layer patterns (refer to 108 of FIG. 1D) are removed. Here, the etch-stop layer patterns (refer to 108 of FIG. 1D) can be removed using phosphoric acid (H3PO4) solution in a temperature range of 120 to 150 degrees Celsius, so that the etch-stop layer patterns (refer to 108 of FIG. 1D) are selectively removed. Consequently, the isolation layers 122 protrude higher than a surface of the first conductive layer patterns 104.

To remove the protruding portions (not shown) of the isolation layers 122, an etch process is performed on the isolation layers 122. The etch process can be performed using a buffered oxide etchant (BOE) or a diluted HF (DHF). Meanwhile, in the process of etching the protruding portions of the isolation layers 122, the buffer oxide layer patterns 106 may be removed together. Therefore, a surface of the first conductive layer patterns 104 is exposed.

To the contrary, after an etch process for lowering the height of the isolation layers 122 is performed, the etch-stop layer patterns (refer to 108 of FIG. 1D) may be removed. In the process of removing the etch-stop layer patterns (refer to 108 of FIG. 1D), the buffer oxide layer patterns (refer to 106 of FIG. 1D) can be etched and removed together. The remaining buffer oxide layer patterns (refer to 106 of FIG. 1D) can be removed using an etch process employing BOE.

Figure 1F:
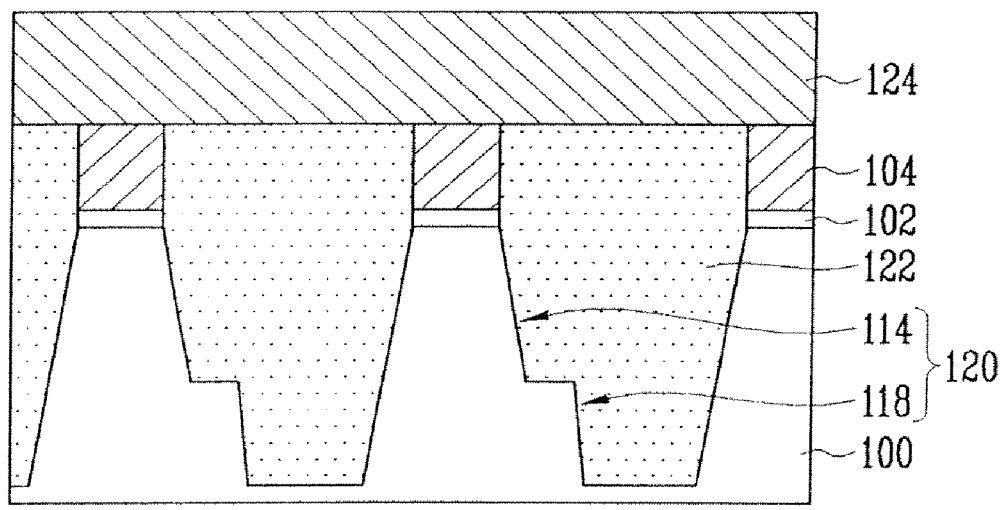

Referring to FIG. 1F, conductive material is deposited on the first conductive layer patterns 104 and the isolation layers 122, thus forming a second conductive layer 124. The second conductive layer 124 is used to form a floating gate of the flash memory device. The second conductive layer 124 can be formed of a polysilicon layer, a metal layer, or a stacked layer of the polysilicon layer and the metal layer. More specifically, the second conductive layer 124 can be formed of the polysilicon layer. When the polysilicon layer is used, a doped polysilicon layer can be used.

Figure 1G:
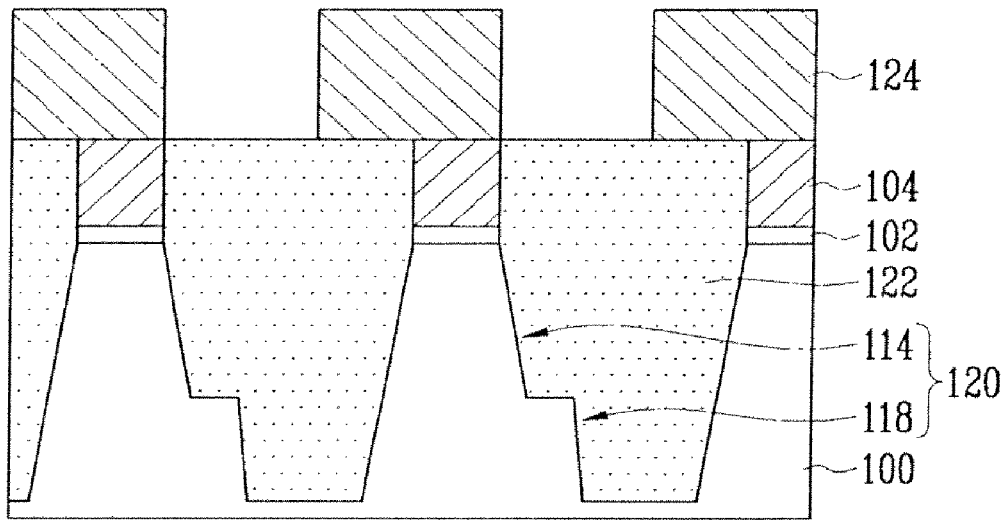

Referring to FIG. 1G, the second conductive layer 124 is patterned using an etch process employing a mask (not shown), thus forming second conductive layer patterns 124 on the first conductive layer patterns 104. Each of the second conductive layer patterns 124 has one side partially overlapping with the isolation layer 122. At this time, the overlapping portion of the second conductive layer pattern 124 is located at a position having a low step within the target trench (120) area comprised of the first and second trenches 114, 118.

In particular, each second conductive layer pattern 124 has a width when the first trench 114 is formed, that is, the same width as that of the floating gate, so that the area of the floating gate, which will be formed later on, is increased relative to the area of the tunnel insulating layer 102. Consequently, the second conductive layer pattern 124 is overlapped with the isolation layer 122 as much as a width corresponding to 1/10 to 9/10 of the second conductive layer pattern 124.

Figure 1H:
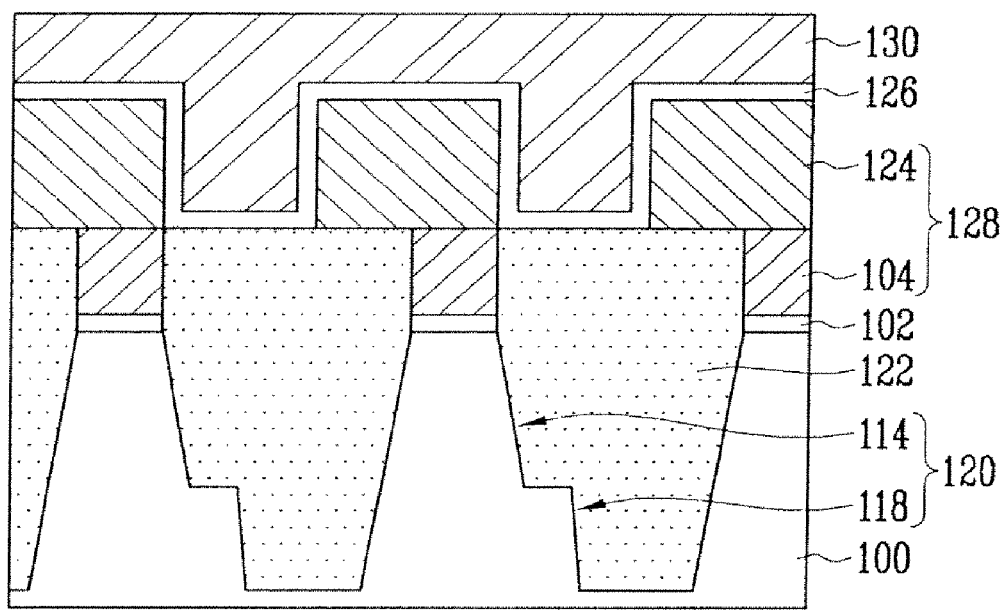

Referring to FIG. 1H, a dielectric layer 126 and a third conductive layer (not shown) are sequentially formed on the second conductive layer patterns 124 including the isolation layers 122. The dielectric layer 126 can have a stacked layer of an oxide layer, a nitride layer and an oxide layer (ONO). The third conductive layer is used to form a control gate of the flash memory device and can be formed of a polysilicon layer, a metal layer, or a stacked layer of the polysilicon layer and the metal layer.

Next, the third conductive layer, the dielectric layer 126, the second conductive layer patterns 124 and the first conductive layer patterns 104 are patterned in a direction crossing the isolation layers 122, that is, a word line direction using a typical etch process employing a mask (not shown). Therefore, ⊓-shaped floating gates 128 respectively comprised of the first conductive layer pattern 104 and the second conductive layer pattern 124 are formed, and a control gate 130 comprised of the third conductive layer patterns is formed.

As described above, according to an embodiment of the present invention, the area of the active region in which the tunnel insulating layer 102 is formed is decreased by performing the etch process employing the shift masks (refer to 116 of FIG. 10), thus relatively increasing the area of the floating gate 128 relative to the area of the tunnel insulating layer 102. Accordingly, the coupling ratio of a cell can be ensured sufficiently and the operation speed of a cell can be enhanced.

According to an embodiment of the present invention, the floating gate 128 is formed of the polysilicon layer having a double structure. In this case, the grain size of the first conductive layer patterns 104 becomes small compared with when the floating gate is formed of a single polysilicon layer. Thus, a cycling characteristic can be improved. This is because grain boundaries are distributed regularly on the tunnel insulating layer patterns 102 every cell by minimizing the grain size of the first conductive layer patterns 104 based on the principle that the grain size decreases as the thickness of the polysilicon layer decreases. Accordingly, uniform and reliable cells can be fabricated.

Further, according to an embodiment of the present invention, various forms of floating gate profiles can be ensured depending on the construction of a mask on the first conductive layer patterns 104.

The present invention has the following advantages.

First, the area of the active region can be reduced and the floating gate can have an existing width, so the area of the floating gate can be increased with respect to the tunnel insulating layer. Accordingly, the coupling ratio of a cell can be ensured sufficiently and the operation speed of a cell can be improved.

Second, since a wide width of the isolation region can be ensured through the shift masks, an existing trench gap-fill technology can be applied to fabrication of high-integrated devices without change. Accordingly, the process can be simplified significantly and the prime cost can be saved.

Third, since the shift masks not requiring additional and complicated mask fabrication are used, desired patterns can be defined stably.

Fourth, if the floating gate is formed of the polysilicon layer of a double structure as in the present invention, the grain size of the underlying polysilicon layer becomes small compared with when using a single polysilicon layer. Accordingly, a cycling characteristic can be improved.

Fifth, various forms of floating gate profiles can be ensured depending on the construction of a mask on the underlying polysilicon layer.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A method of fabricating a flash memory device, the method comprising:
   providing a semiconductor substrate in which first trenches are formed in an isolation region and a stacked layer of a tunnel insulating layer and a first conductive layer is formed in an active region;
   etching the first conductive layer and the tunnel insulating layer by employing etch masks through which a part of the first conductive layer and a part of the first trenches are exposed on boundaries of the isolation region and the active region, thus reducing a width of the active region, and etching the semiconductor substrate including the first trenches to thereby form second trenches deeper than the first trenches;
   forming isolation layers to gap-fill between the first and second trenches and the first conductive layers; and
   forming a second conductive layer on the first conductive layer so that one side of second conductive layer is partially overlapped with the isolation layers.

2. The method of claim 1, wherein the etch masks are shifted 10 to 90% toward the isolation region.

3. The method of claim 1, wherein an area in which the first and second trenches are formed has a width increased as much as the reduced width of the active region.

4. The method of claim 1, wherein the first trench has a width smaller than that of a target trench.

5. The method of claim 1, wherein the first trench is shallower than a target depth.

6. The method of claim 1, wherein one side of an area in which the first and second trenches are formed has a stair-shaped step.

7. The method of claim 1, wherein the second conductive layer is overlapped on a lower step side within an area in which the first and second trenches are formed.

8. The method of claim 7, wherein the first and second conductive layers constitute a ⊓-shaped floating gate.

9. The method of claim 1, wherein a width of the second conductive layer is overlapped with the isolation layer from $1/10$ to $9/10$ the width of the second conductive layer.

10. The method of claim 1, wherein the first and second conductive layer are formed from polysilicon.

11. The method of claim 1, wherein the isolation layer is formed of a HDP oxide layer.

12. The method of claim 1, further comprising:
    forming a dielectric layer on the isolation layers and the second conductive layer; and
    forming a third conductive layer on the dielectric layer.

* * * * *

UNITED STATES PATENT AND TRADEMARK OFFICE
CERTIFICATE OF CORRECTION

| | | |
|---|---|---|
| PATENT NO. | : 7,932,159 B2 | Page 1 of 1 |
| APPLICATION NO. | : 12/943578 | |
| DATED | : April 26, 2011 | |
| INVENTOR(S) | : Dong | |

It is certified that error appears in the above-identified patent and that said Letters Patent is hereby corrected as shown below:

On the Title Page, please insert:

Item -- (62) Related U.S. Application Data

Division of application no. 12/147,194 filed June 26, 2008, now Patent No. 7,855,409. --

Signed and Sealed this
Seventh Day of June, 2011

David J. Kappos
*Director of the United States Patent and Trademark Office*